United States Patent
Aweya et al.

(10) Patent No.: US 7,656,985 B1
(45) Date of Patent: *Feb. 2, 2010

(54) TIMESTAMP-BASED ALL DIGITAL PHASE LOCKED LOOP FOR CLOCK SYNCHRONIZATION OVER PACKET NETWORKS

(75) Inventors: James Aweya, Kanta (CA); Michel Ouellette, Orleans (CA); Delfin Y. Montuno, Kanata (CA); Kent Felske, Kanta (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 702 days.

This patent is subject to a terminal disclaimer.

(21) Appl. No.: 11/279,431

(22) Filed: Apr. 12, 2006

Related U.S. Application Data

(63) Continuation-in-part of application No. 10/076,415, filed on Feb. 19, 2002, now Pat. No. 7,043,651.

(60) Provisional application No. 60/732,276, filed on Nov. 1, 2005.

(51) Int. Cl.
    *H03D 3/24* (2006.01)
(52) U.S. Cl. ............... 375/373; 375/376; 375/371; 375/355; 375/326; 370/497; 331/179; 331/16; 713/400
(58) Field of Classification Search ............... 370/497; 375/373, 326, 376; 331/179, 16; 713/400
    See application file for complete search history.

(56) References Cited

U.S. PATENT DOCUMENTS

| 6,801,591 | B1* | 10/2004 | Frencken ............... 375/373 |
| 7,020,791 | B1* | 3/2006 | Aweya et al. ............ 713/400 |
| 7,130,368 | B1* | 10/2006 | Aweya et al. ............ 375/376 |
| 7,289,538 | B1* | 10/2007 | Paradise et al. .......... 370/497 |
| 2003/0056136 | A1* | 3/2003 | Aweya et al. ............ 713/400 |
| 2005/0024152 | A1* | 2/2005 | Lyden et al. ............ 331/16 |
| 2005/0249315 | A1* | 11/2005 | Hartman et al. .......... 375/326 |
| 2007/0085622 | A1* | 4/2007 | Wallberg et al. .......... 331/179 |

OTHER PUBLICATIONS

U.S. Appl. No. 11/279,410; Claims; pp. 25-28; filed Apr. 2006.*

* cited by examiner

*Primary Examiner*—Sudhanshu C Pathak
(74) *Attorney, Agent, or Firm*—Anderson Gorecki & Manaras LLP

(57) ABSTRACT

A timestamp-based all digital phase locked loop is utilized for clock synchronization for Circuit Emulation Service ("CES") over packet networks. The all digital phase locked loop at a CES receiver includes a phase detector, a loop filter, a digital oscillator and a timestamp counter. The all digital phase locked loop enables the CES receiver to synchronize a local clock at the receiver with a clock at a CES transmitter, where indications of transmitter clock signals are communicated to the receiver as timestamps. The phase detector is operable to compute an error signal indicative of differences between the timestamps and a local clock signal. The loop filter is operable to reduce jitter and noise in the error signal, and thereby produce a control signal. The digital oscillator is operable to oscillate at a frequency based at least in-part on the control signal, and thereby produce a digital oscillator output signal. The timestamp counter operable to count pulses in the digital oscillator output signal, and output the local clock signal.

18 Claims, 14 Drawing Sheets

Packet Delay Variation

Phase Output from Phase Accumulator

Sine Output from Sine Computation Function

TIMESTAMP-BASED ALL DIGITAL PHASE LOCKED LOOP FOR CLOCK SYNCHRONIZATION OVER PACKET NETWORKS

CROSS-REFERENCE TO RELATED APPLICATIONS

This application is a Continuation-in-Part of U.S. patent application Ser. No. 10/076,415, entitled Technique for Synchronizing Clocks in a Network, filed Feb. 19, 2002 now U.S. Pat. No. 7,043,651, which is incorporated by reference. A claim of priority is also made to U.S. provisional patent application Ser. No. 60/732,276, entitled TECHNIQUE FOR DIFFERENTIAL CLOCK RECOVERY IN PACKET NETWORKS, filed Nov. 1, 2005, which is incorporated by reference.

FIELD OF THE INVENTION

This invention relates generally to the field of network communications, and more particularly to clock synchronization for Circuit Emulation Service.

BACKGROUND OF THE INVENTION

Circuit Emulation Service ("CES") allows time division multiplexing ("TDM") services such as DS-n and E-n circuits to be transparently extended across a packet network. With circuit emulation over IP, for example, TDM data received from an external device at the edge of an Internet Protocol ("IP") network is converted to IP packets, sent through the IP network, passed out of the IP network to its destination, and reassembled into a TDM bit stream. One application of CES is the interconnection of enterprise private telephone networks at different sites. For example, CES over a packet network can be used to connect two private branch exchanges ("PBXs") on two different campuses without having packet transport capabilities on the PBXs themselves. This interworking allows voice traffic between the two campuses to use a packet network backbone instead of leased TDM lines, and also allows voice and data traffic to use the same packet network.

In order for CES to function properly it is desirable to achieve the same clock in both the transmitting and receiving ends of a TDM circuit from end-to-end such that, for example, the T1 stream of a downstream PBX transmits with the same clocking characteristics as the T1 stream of the upstream PBX. Known clocking techniques include both synchronous and asynchronous clocking modes, of which the asynchronous clocking modes include Differential Clock Recovery, Independent Clocking, Clock Recovery using Simple Timestamps, Adaptive Buffer-Fill-based Clock Recovery, and Adaptive Packet Inter-arrival Time Averaging-based Clock Recovery.

In the timestamp-based technique for clock synchronization, a master periodically sends explicit time indications or timestamps to a slave to enable the slave to synchronize its local clock to the transmitter's clock. This synchronization strategy allows multiple slaves, for example in a broadcast or point-to-multipoint communication scenario, to synchronize their clocks to the master. The master clock could consist essentially of an oscillator and a pulse counter. The oscillator issues periodic pulses that constitute the input to the pulse (timestamp) counter. The output of the counter represents the master clock signal and is incremented by a fixed amount at each pulse. Samples of master clock signals are communicated to the slave as timestamps. A receiving TDM terminal node employs an adaptive timing technique to reconstruct the timing signal of the transmitting TDM terminal from the timestamps. This is commonly done using a PLL that slaves the receiver clock to a transmitter clock. The PLL is able to process the transmitted timestamps to generate timing signal for the receiver. The purpose of the PLL is to estimate and compensate for the frequency drift occurring between the oscillators of the transmitter clock and the receiver clock. However, the presence of packet delay variation jitter and packet losses can affect the performance of the clock estimation/compensation process, making the transmitter clock appear faster or slower than it actually is, and ultimately, causing the propagation of some residual jitter up to the receiver clock signal.

SUMMARY OF THE INVENTION

In accordance with one embodiment of the invention, apparatus for synchronizing a local clock at a receiver with a clock at a transmitter, where indications of transmitter clock signals are communicated to the receiver as timestamps, comprises: a phase detector operable to compute an error signal indicative of differences between the timestamps and a local clock signal; a loop filter operable to reduce jitter and noise in the error signal, and thereby produce a control signal; a digital oscillator operable to oscillate at a frequency based at least in-part on the control signal, and thereby produce a digital oscillator output signal; and a timestamp counter operable to count pulses in the digital oscillator output signal, and output the local clock signal.

In accordance with another embodiment of the invention, a method for synchronizing a local clock at a receiver with a clock at a transmitter, where indications of transmitter clock signals are communicated to the receiver as timestamps, comprises the steps of: computing, with a phase detector, an error signal indicative of differences between the timestamps and a local clock signal; reducing jitter and noise in the error signal with a loop filter, thereby producing a control signal; producing a digital oscillator output signal with a digital oscillator operable to oscillate at a frequency based at least in-part on the control signal; and counting pulses in the digital oscillator output signal with a timestamp counter, thereby producing the local clock signal.

The all digital phase locked loop ("ADPLL") offers advantages relative to currently known techniques. For example, the ADPLL alleviates some of the problems associated with its analog counterpart such as sensitivity to dc drifts and component saturations, difficulties encountered in building higher order loops, the need for initial calibration and periodic adjustments. Further, the ADPLL is relatively inexpensive to fabricate, is more reliable, smaller in size, and requires relatively few initial adjustments. Consequently, the ADPLL facilitates performance of elaborate real-time processing on digital samples.

DETAILED DESCRIPTION

Figure 1:
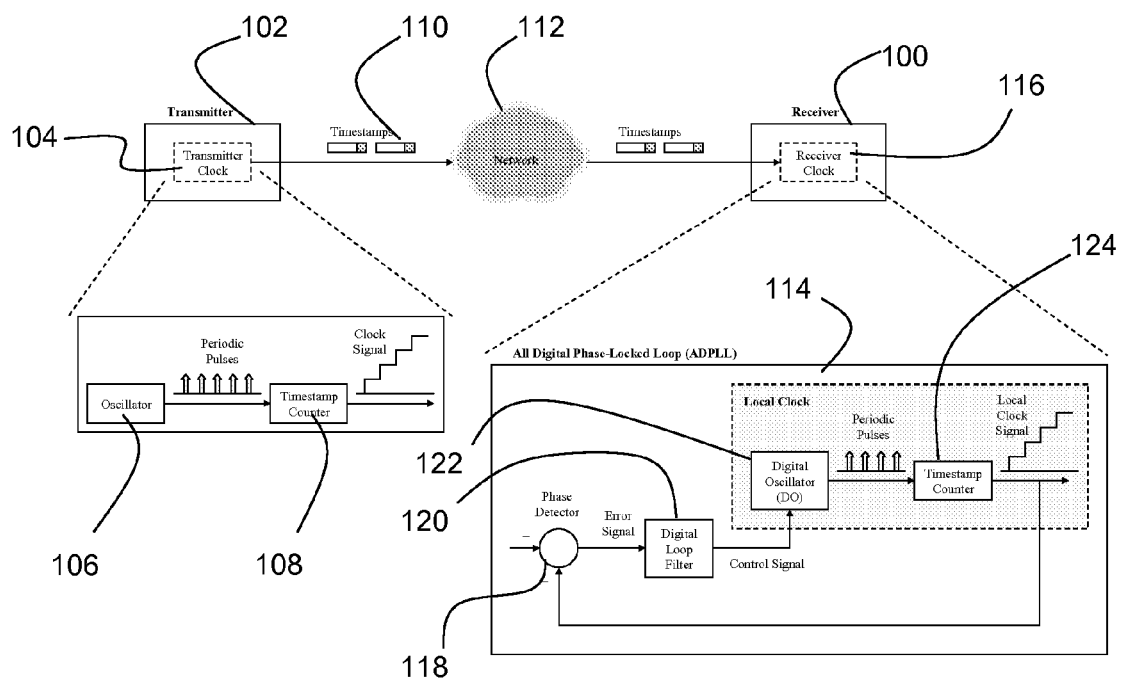
FIG. 1 is a block diagram of a clock synchronization scheme based on timestamps employing an all digital phase-locked loop ("ADPLL") at the receiver.

A block diagram of a clock synchronization technique based on timestamps is shown in FIG. 1. This technique enables multiple receivers (100) (only one receiver is illustrated) to synchronize their clocks to a transmitter (102). Examples of multiple receivers include broadcast and point-to-multipoint communications. The transmitter (102) includes a clock (104) having an oscillator (106) and a timestamp counter (108). The oscillator issues periodic pulses that are communicated to the timestamp counter. The timestamp counter is operable to count the pulses. The output of the timestamp counter represents the transmitter clock signal, and is incremented by a fixed amount at each pulse. Samples of transmitter clock signals are communicated to the receiver as timestamps (110) via a network (112).

An all digital phase locked loop ("ADPLL") (114) in a clock (116) at the receiver (100) uses the timestamps (110) as a reference signal to synchronize the receiver clock (116) with the transmitter clock (104). The ADPLL has four main components: a phase detector (118), a loop filter (120), a digital oscillator ("DO") (122), and a timestamp counter (124). The phase detector computes an error signal as the difference between the inputted reference signal (timestamps (110)) and an output signal of the timestamp counter (124). The error signal is passed on to the loop filter (120), which is operable to reduce or eliminate possible jitter and noise in the input signal. The DO (122), which may have a center frequency, oscillates at a frequency which is determined by the output signal of the loop filter, and produces periodic pulses. The timestamp counter produces the local clock signal, which is synchronized with the transmitter clock, from the periodic pulses.

Figure 2:
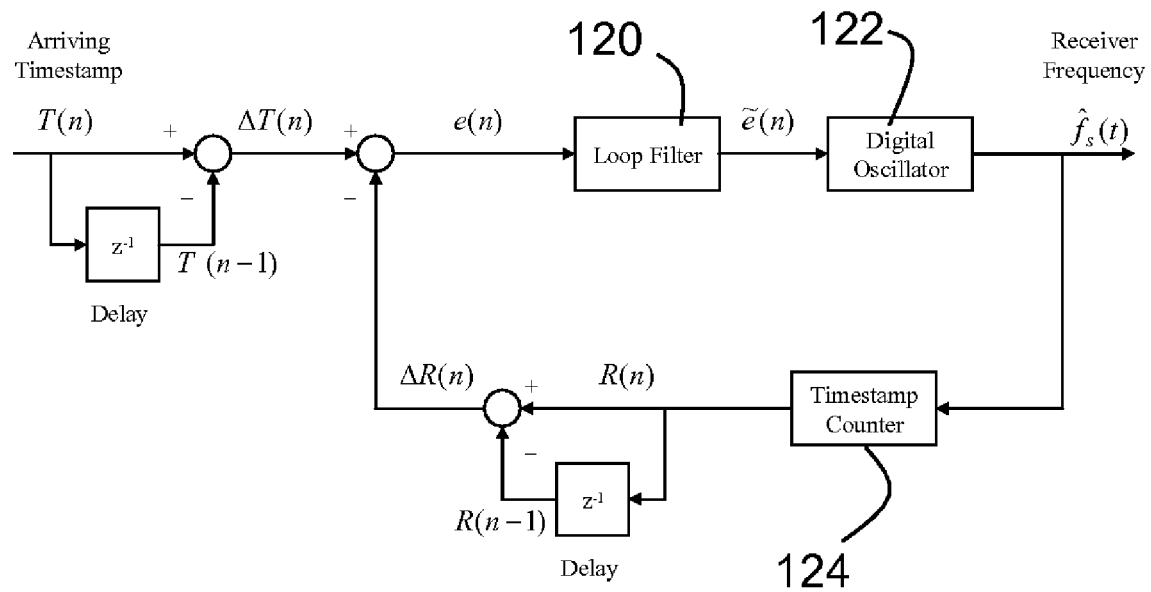
FIG. 2 illustrates a control model of the ADPLL of FIG. 1.
Figure 3:
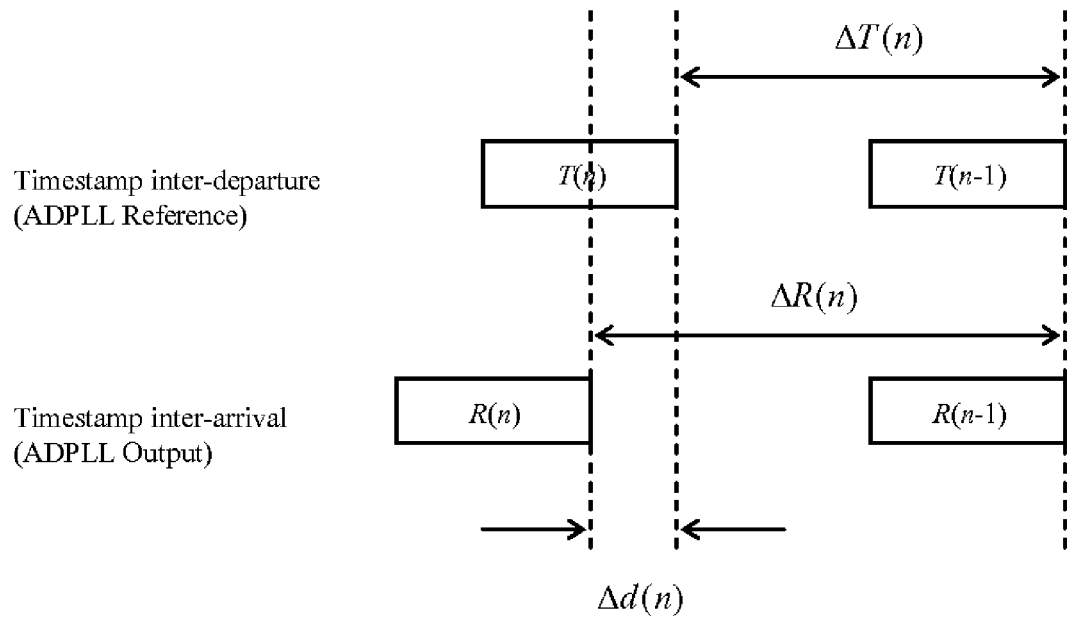
FIG. 3 illustrates a diagram of arrival of timestamps at the ADPLL of FIG. 1.

Referring now to FIGS. 1, 2 and 3, operation of the ADPLL (114) will be described in greater detail. The following definitions will be used. $T(n)$ denotes the time base, e.g., in clock ticks, of the transmitter and $R(n)$ denotes the time base of the receiver. These two functions correspond to the timestamps of the two clocks at discrete time instants n, where n=0, 1, 2, K. When timestamps are transmitted over the packet network (112), they tend to arrive at the receiver (100) with variable delay. If $d(n)$ and $d(n-1)$ denote the delay experienced by the nth and (n-1)th timestamp at the receiver, respectively, then the delay variation induced by the network is $j(n)=d(n)-d(n-1)$. The timestamp difference between the nth and (n-1)th generated timestamp at the transmitter is defined as $\Delta T(n)=T(n)-T(n-1)$. At the receiver, the timestamp difference between the nth and (n-1)th timestamp arrivals as measured by the receiver clock is defined as $\Delta R(n)=R(n)-R(n-1)$. It should be noted that the timestamp difference measured by the receiver includes the packet delay variation experienced between the two arrivals, that is, $\Delta R(n)=\Delta T(n)+j(n)$. If there is zero network delay variation and the transmitter and receiver have the same frequency, then $\Delta R(n)=\Delta T(n)$.

In view of the definitions above, the clock recovery problem is formulated as follows: while filtering out delay variation, the receiver clock frequency $\hat{f}_s=1/\hat{\tau}_s$ is controlled so that the receiver clock measurements $\Delta R(n)$ are equal to the transmitter clock timestamp differences $\Delta T(n)$. The difference between $\Delta T(n)$ and $\Delta R(n)$ forms an error signal, $e(n)=\Delta T(n)-\Delta R(n)$. This error signal is filtered by the loop filter (120) of the ADPLL, the output of which controls the frequency $\hat{f}_s=1/\hat{\tau}_s$ of the DO of the receiver clock. The function of the ADPLL is to control the receiver clock frequency $\hat{f}_s$; such that the error e goes to zero, at which point the receiver frequency equals the transmitter frequency $f_s$. The loop filter (120) is a low-pass filter. The ADPLL at the receiver therefore takes $\Delta T(n)$ as its reference input and generates $\Delta R(n)$ as its output, i.e., the controlled process.

Figure 4:
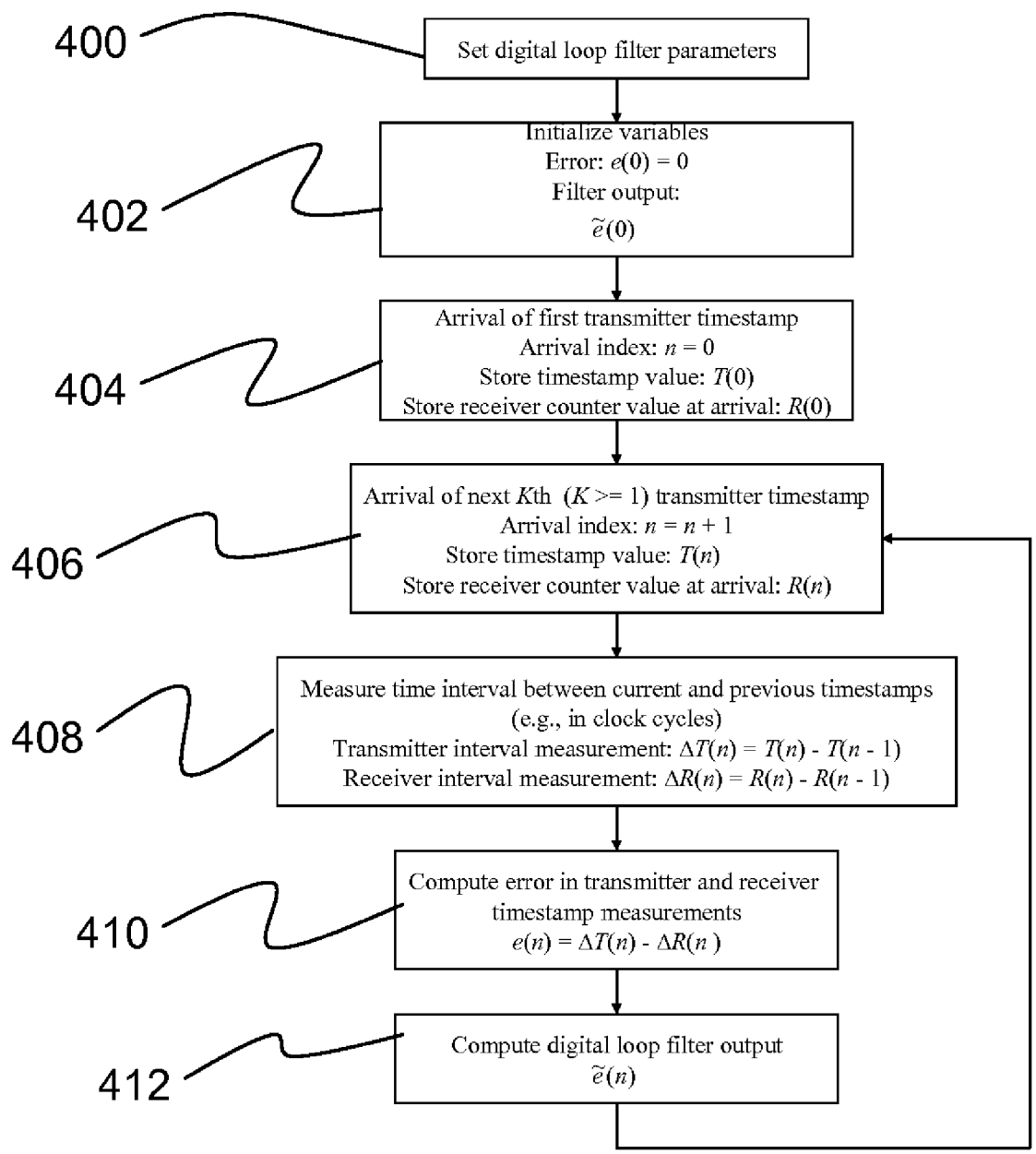
FIG. 4 illustrates an algorithm used to estimate the control signal of the ADPLL.

FIG. 4 illustrates an algorithm used for controlling the DO to estimate the transmitter clock. The measurement/computational instants in the flowchart occur at the timestamp arrival instants at the receiver. At steps (400), (402) and (404), the ADPLL at the receiver sets loop filter parameters and initializes variables as indicated while waiting for the first timestamp to arrive. When the first timestamp arrives it is loaded into the counter. From this point onward, the ADPLL operates in a closed-loop fashion. As indicated in step (406), each time the Kth (K≧1, where K is a down sampling parameter) timestamp arrives, i.e., at sampling instant n=1, 2, 3, K, the difference $\Delta T(n)$ between this value $T(n)$ and the value at the previous sampling instant $T(n-1)$ is determined as indicated in step (408). The difference $\Delta T(n)$ is then compared to the timestamp inter-arrival time $\Delta R(n)=R(n)-R(n-1)$ measured by the receiver ADPLL counter to give an error term $e(n)=\Delta T(n)-\Delta R(n)$ as indicated in step (410). This error term is sent to the loop filter, the output of which controls the frequency of the DO. The output of the DO, computed in step (412), in turn provides the clock frequency of the receiver and also drives the counter. After some settling time has elapsed, the error term is expected to converge to zero. At that point in time the ADPLL is considered locked to the incoming time base of the transmitter.

Referring again to FIG. 1, the DO (122) is operable to produce an accurate reference signal, the frequency and phase of which can be precisely controlled in real time. The DO may be a "frequency synthesizer," which is an active electronic device that accepts an input reference frequency and then generates one or more new ones as commanded by a control word, whereby the stability, accuracy, and spectral purity of the output correlates with the performance of the input reference. The function of the DO is similar to that of a voltage controlled oscillator ("VCO") in an analog phase locked loop ("PLL"). The VCO output frequency is a function of its input voltage, which is proportional to the phase error signal. In the ADPLL with a DO, the time period of the DO is controlled directly. The output of the loop filter in the form of a correction (or control) word, is used to control the period of the DO in such a way as to decrease the error signal generated by the phase detector. At least two types of DOs may be utilized: the divide-by-N counter type oscillator ("DNCO") and the direct digital synthesizer ("DDS").

Figure 5:
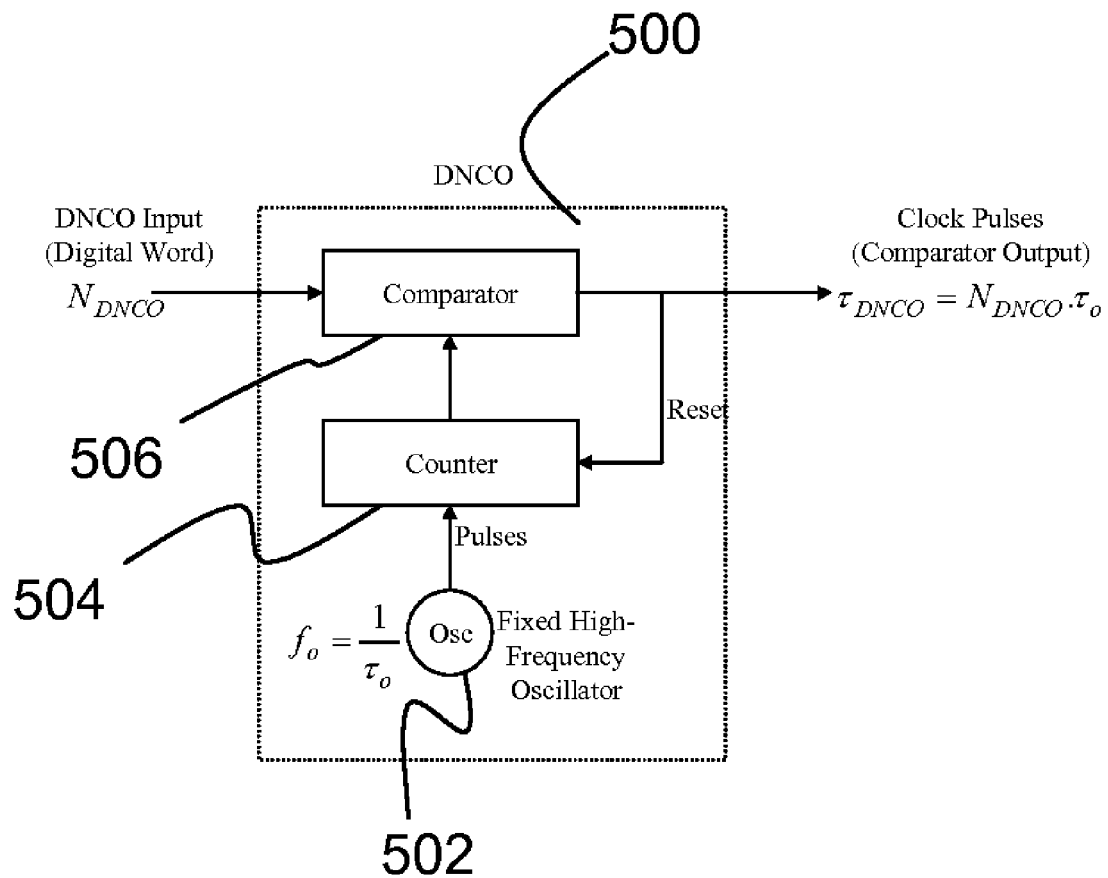
FIG. 5 illustrates a functional block diagram of a DNCO employed as the DO.

FIG. 5 illustrates a functional block diagram of a DNCO (500) employed as the DO. The DNCO behaves essentially as a programmable divide-by-N counter. The output of a stable high-speed oscillator (502) is used to drive the counter (504) which increases by one every clock cycle. The high-speed oscillator usually has a frequency, $f_o$ equal to $N_{nom}$ times the nominal frequency, $f_{nom}=1/\tau_{nom}$, where $N_{nom}$ determines the number of quantization levels and the phase error resolution over $2\pi$. The comparator (506) compares the content of the counter with the control input value $N_{DNCO}$ and, when they match, outputs a pulse which serves both as the DNCO output and a reset signal for the counter. Thus, the period of the counter output (the time between reset pulses) is proportional to $N_{DNCO}$. By varying the control input $N_{DNCO}$, the DNCO period can be controlled.

Figure 6:
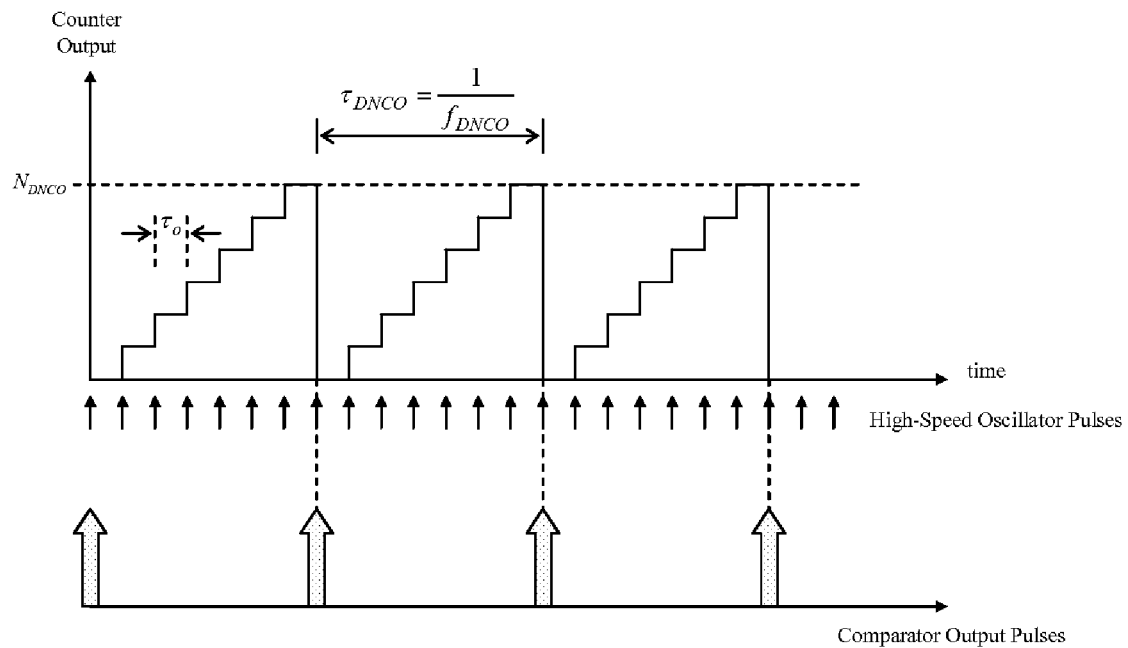
FIG. 6 illustrates a timing diagram of the DNCO of FIG. 5.

Referring now to FIGS. 5 and 6, the DNCO (500) operates with a control input $N_{nom}$ which corresponds to the nominal frequency $f_{DNCO}=f_{nom}=1/\tau_{nom}$. Adding a negative quantity $-N_{corr}$ to $N_{nom}$ results in an increase in the output frequency, $\tau_{DNCO}=(N_{nom}-N_{corr})\tau_o$, whereas adding a positive quantity $+N_{corr}$ to $N_{nom}$ results in a decrease in the output frequency, $\tau_{DNCO}=(N_{nom}+N_{corr})\tau_o$. Thus, by appropriately controlling the correction factor $N_{corr}$ added to $N_{nom}$, the output frequency of the DNCO $f_{DNCO}=1/\tau_{DNCO}$ can be controlled accordingly.

Figure 7:
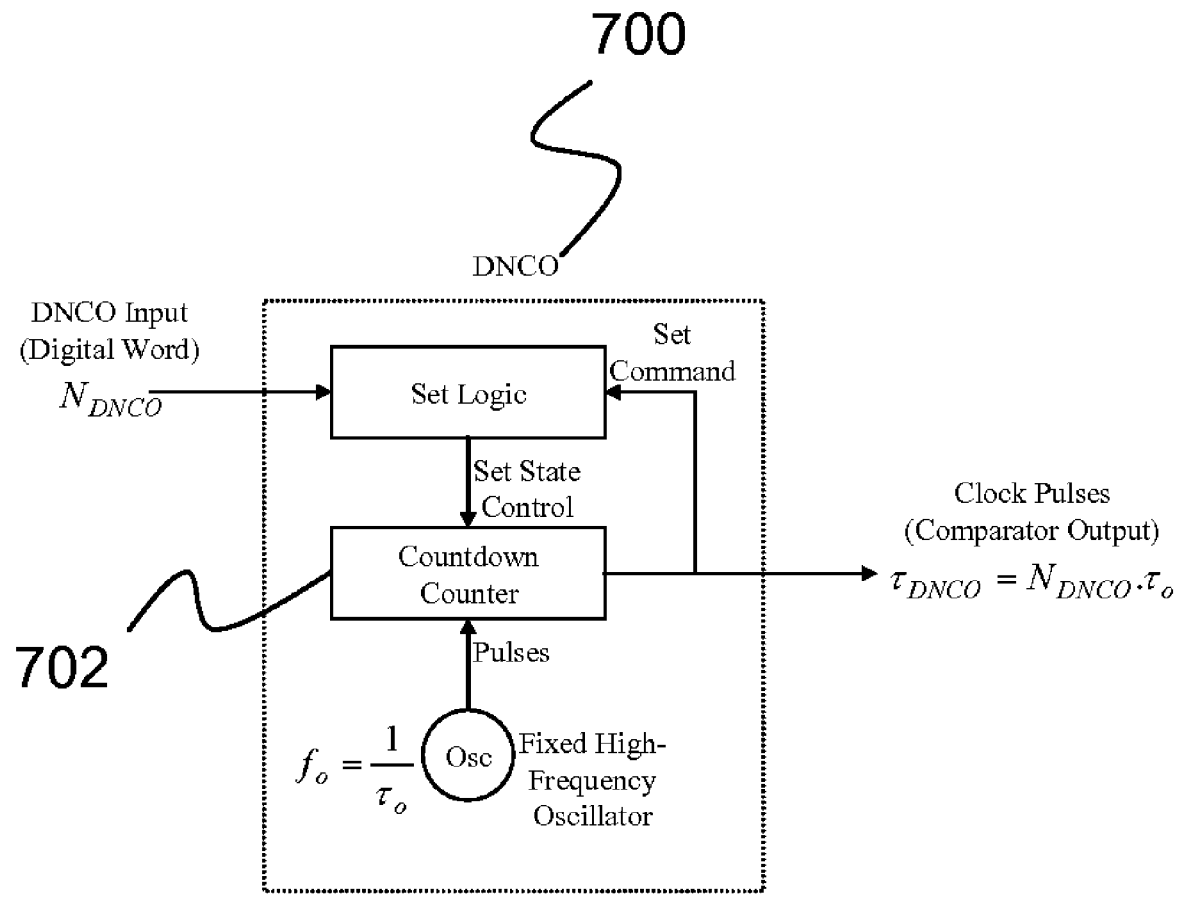
FIG. 7 illustrates an alternative embodiment of the DNCO of FIG. 5.

An alternative DNCO (700) is illustrated in FIG. 7. A countdown counter (702) is preset to count $N_{DNCO}$ and counts down to zero. Upon hitting the zero state, an output clock pulse is generated and the countdown counter is reset to $N_{DNCO}$ for the beginning of the next period. This approach may be preferable to embodiments with an up-counter because the delay in recognizing the zero state is constant for any count.

Figure 8:
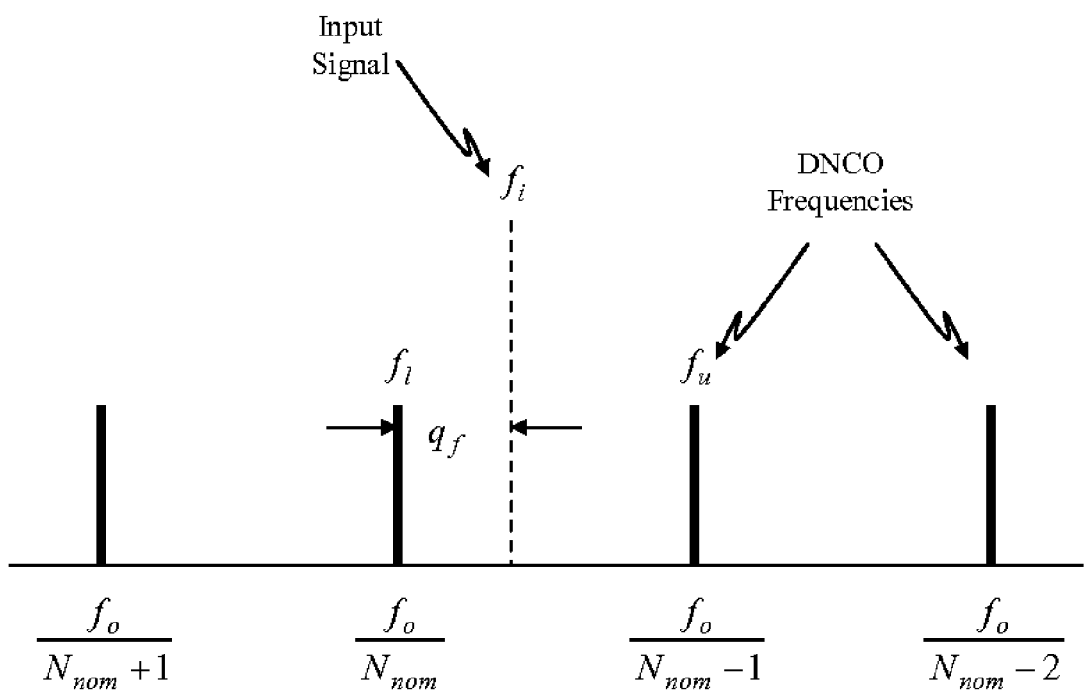
FIG. 8 illustrates frequency quantization of the DNCO of FIG. 5.

Referring to FIG. 8, it should be noted that frequency quantization is an important consideration in the design of the ADPLL. Frequency quantization arises because the DNCO only operates on discrete frequencies. The ADPLL tracks the input signal frequency $f_i$ ($f_o/N_{nom}<f_i<f_o/(N_{nom}-1)$, $N_{nom}>0$ is an integer) by switching between frequencies $f_i=f_o/N_{nom}$ and $f_u=f_o/(N_{nom}-1)$ such that the average frequency of operation is $f_i$. For small quantization errors, it is required that $f_o>>f_{nom}$, where $f_{nom}=1/\tau_{nom}$ is the nominal frequency of operation, e.g., 1.544 MHz for a T1 link. The phase error which may occur in the DNCO due to frequency quantization is $$\frac{\Delta\varphi}{2\pi} = \frac{\tau_o}{\tau_{nom}},$$

or $$\Delta\varphi = \frac{2\pi f_{nom}}{f_o} = \frac{2\pi}{N_{nom}} = \frac{360°}{N_{nom}}.$$

For small quantization errors, for example, $\Delta\phi \leq 7.2°$ requires that $N_{nom} \geq 50$. Between samples, the phase error changes in a linear manner at a rate proportional to the difference between the input frequency and the DNCO frequency. Since the loop averages two frequencies, one of which could be $q_f$ Hz from the input frequency, a phase change of $$\Delta\phi=2\pi q_f T_s,$$

can occur between samples, where $T_s$ is a sampling interval. Given that $\Delta\phi/2\pi=f_{nom}\tau_o$, the quantization increment $q_f$ can be expressed as $$q_f = \frac{\Delta\varphi}{2\pi T_s} = \frac{f_{nom}\tau_o}{T_s}.$$

Figures 9A, 9B:
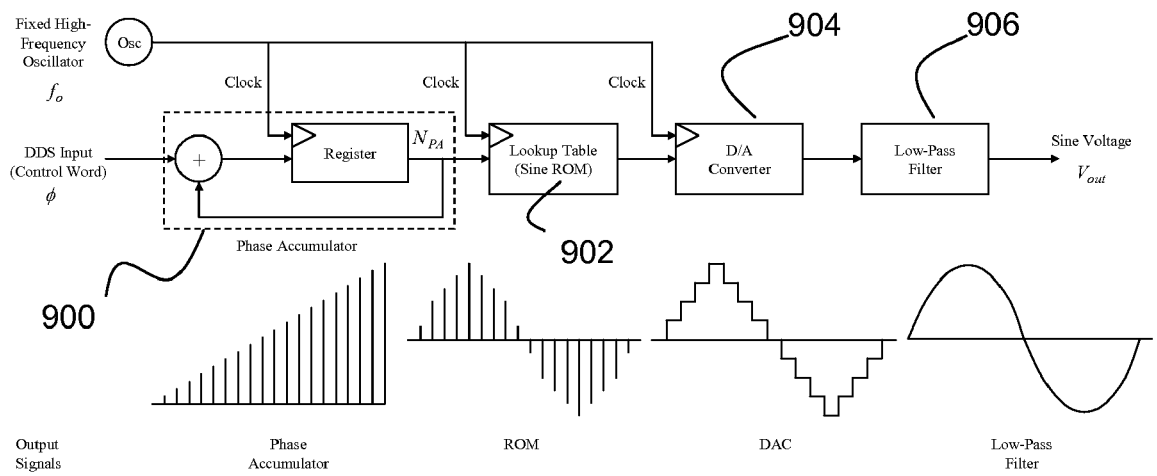
FIG. 9a illustrates a functional block diagram of a DDS employed as the DO.
FIG. 9b illustrates the signals at the various stages of the DDS.

FIG. 9a illustrates a functional block diagram of a DDS employed as the DO (122, FIG. 1). Conventional DDS architecture can be viewed as three common digital components: a phase accumulator (or adder/accumulator) (900), a mapping device (such as a read-only-memory ("ROM") or random-access memory ("RAM")) (902), and a digital-to-analog ("DAC") (904). A low-pass filter (906) may be employed at the output of the DAC, but this component is not normally considered a part of the DDS. The reference clock $f_o=1/\delta t$ must operate at higher frequency than the synthesized clock because of Nyquist theorem. The phase accumulator generates the phase component of the output clock. It is implemented as a q-bit adder, with two inputs; the phase increment word $\phi=\Delta\theta$ and the previous sum. The range of phase numbers $2^q$ is spread across one cycle of the sine wave, thus we make $2\pi=2^q$. Substituting this into (14), we get the generated output frequency as $$f_{out} = \frac{\phi \cdot f_o}{2^q}.$$

The phase accumulator represents a cyclic phase generator producing a time series of binary integer values (phase sequence) corresponding to the oscillator progression of phase. The phase sequence is generated by a q-bit accumulator clocked at the sample rate, $f_o=1/\delta t$, which accumulates a phase increment, $\phi$, modulo $2^q$.

The phase accumulator is capable of repeatedly adding a programmable binary phase input value $\phi$ to the content of the accumulator. This is equivalent to performing the following mathematical integration $$N_{PA}(n\delta t)=[N_{PA}(n\delta t-\delta t)+\phi]\text{modulo } 2^q,$$

where $N_{PA}(n\delta t)$ is the content of the phase register (represents DDS phase in fractional cycles), and n is the time index, and $\delta t$ is the sampling interval. The value of $N_{PA}(n\delta t)$ is bounded by the width (number of bits) of the input $\phi$ and of the accumulator (q number of bits). Note that a cycle is equal to $2^q$, so $N_{PA}(n\delta t)$ is always modulo $2^q$. $N_{PA}(0)$ represents the accumulator initial condition at n=0, which can take a value of zero or higher value to produce an initial phase shift. The complete set of discrete states generated by the accumulator may be evenly mapped as phase values around a circle. This would correspond to the discrete output waveform values. The restriction imposed on the phase accumulator by the finite width results in an overflow inherent in the binary adder. This implies a phase zero crossing upon overflow. The frequency of overflow may be reduced by increasing the width of the binary adder. From this we see that the DDS phase output in radians is $$\theta_{PA} = \frac{2\pi}{2^q} N_{PA}(n\delta t).$$

This means the DDS divides the range of the input signal $(0, 2\pi)$ into $2^q$ equal increments. The stored value in the accumulator represents the current phase of a cyclical function. The input to the phase accumulator is the frequency control word $\phi$. Since this word represents a q-bit digital value, the output frequency of the DDS $f_{out}$ is changed by variation of the input control word. The above phase accumulator arrangement constitutes a frequency generator at a fixed rate for given values of $\phi$ and $f_o = 1/\delta t$.

Figure 10A:
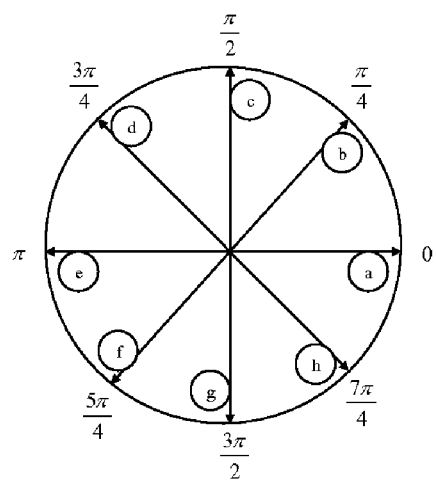
FIG. 10a illustrates phase output from the phase accumulator.
Figure 10B:
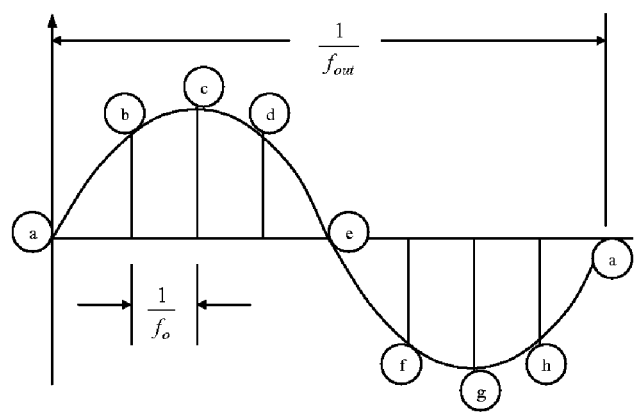
FIG. 10b illustrates sine output from the sine computation function.

Referring to FIGS. 9a, 10a and 10b, once the phase information is generated it is converted to a sinusoidal value. The lookup table (902) stores samples of a sinusoid. The phase accumulator (900) is used to generate a suitable phase argument that is mapped by the lookup table to the desired output waveform. Thus, the second component in a DDS is a memory or mapping device that performs the nonlinear transformation of $\omega t \Rightarrow \sin(\omega t)$. The size of the phase increment determines the actual output frequency. The binary width of the phase accumulator (accumulator overflows) determines the minimum frequency, which is equal to the frequency step, achievable by the DDS. The frequency increment (or resolution) of a DDS is defined as $$\delta f_{out} = \frac{f_o}{2^q}.$$

The frequency resolution of the DDS is a function of the clock frequency $f_o$ and the number of bits q employed in the phase accumulator. Clearly, the wider the phase accumulator, the finer the resulting frequency tuning step. The phase accumulator should have a sufficient field width to span the desired frequency resolution. For practical applications, a large number of bits are allocated to the phase accumulator in order to satisfy the system frequency resolution requirements. Given the resolution $\delta f_{out}$ and the clock frequency, the required number of bits is given as $$q = \log_2\left[\frac{f_o}{\delta f_{out}}\right].$$

Given that there is a direct mapping of phase to amplitude, a ROM/RAM lookup table can be used to convert the phase values. The phase accumulator generates a discrete time phase sequence $N_{PA}(n\delta t)$, which is then mapped to the amplitude domain using a lookup table containing a single sinusoid. The digitized phase mapping from the phase accumulator is used to address the ROM/RAM which contains the stored values of the desired output waveforms.

FIG. 10a shows phase accumulation of a generated sine wave whose frequency is equal to ⅛ of the clock frequency. The circle shows the phase accumulation process of $\pi/4$ at each clock cycle. The dots on the circle represent the phase value at a given time and the sine wave shows the corresponding amplitude representation. This phase to amplitude conversion occurs in the sine lookup table. Note that the phase increment added during each clock period is $\pi/4$ radians, which is equal to ⅛ of $2\pi$. The phase value stored in an input frequency register is added to the value in the phase accumulator once each period of the system clock. The resulting phase value (from 0 to $2\pi$) is then applied to the sine lookup once during each clock cycle. The lookup converts the phase information to its corresponding sine amplitude as illustrated in FIG. 10b.

Referring again to FIG. 9a, if an analog output is required, the DDS presents the digital samples from the lookup table to a digital-to-analog converter ("DAC") and a low-pass filter to obtain an analog waveform with the specific frequency structure. Of course, the samples may be used directly in the digital domain. The function of the DAC (paired with the low-pass filter) is to reconstruct the discrete waveform. The DAC is required to transform the digital sine information into the analog domain. The DAC converts the output values from the ROM/RAM lookup table (i.e., the digital amplitude information) into analog output $V_{out}(t)$. A high speed DAC is used to make this conversion. Resolution of the DAC determines the quality of the output waveform.

Referring again to FIG. 9a, each digitized sine wave output from the DDS is converted to an analog waveform by the DAC (904). The output of the DAC has the desired sine wave as a major component, but also includes the higher frequency image components due to the conversion of a sampled waveform. The Low-Pass Filter ("LPF") (906) is used to reduce these image signals to the desired level. There can be additional degradation of the output waveform related to both harmonics of the frequency being generated and the clock rate of the DAC. Non-ideal behavior of the DAC will introduce distortion that shows up as harmonic spurs. Slow edge rates or delay mismatch on the signals switching the current or settling time, over/under shoot, and glitch impulses at the DAC output can lead to this harmonic distortion. When operating well below Nyquist, these harmonics appear directly in the pass band and usually can be handled with appropriate filter at the output. However, when generating frequencies that approach Nyquist, these harmonics can mix with the reference clock and can produce spurs that fall back onto or near the fundamental (this phenomenon is know as aliasing).

The phase accumulator (900) is a variable-modulus counter that increments the number stored in it each time it receives a clock pulse. When the counter overflows it wraps around, making the phase accumulator's output contiguous. The larger the added increment $\phi$, the faster the accumulator overflows, which results in a higher output frequency.

The output frequency $f_{out}$ of the DDS waveform is a function of the system clock frequency $f_o$, the number of bits q in the phase accumulator and the phase increment value $\phi$. The phase increment value required to generate an output frequency $f_{out}$ Hz is $$\phi = \frac{2^q f_{out}}{f_o}.$$

The phase increment $\phi$ is an unsigned value. The phase increment term defines the DDS output frequency. If the DDS is operating with a control input $\phi_{nom}$ which corresponds to the nominal frequency $f_{DDS} = f_{nom}$, adding a quantity $-\Delta\phi$ to $\phi_{nom}$ (i.e., $\phi_{DCO} = \phi_{nom} - \Delta\phi$) results in a decrease in the output frequency, $f_{DDS} = f_{nom} - \Delta f$, whereas adding a quantity $+\Delta\phi$ to f (i.e., $\phi_{DDS} = \phi_{nom} + \Delta\phi$) results in an increase in the output frequency, $f_{DDS}=f_{nom}+\Delta f$. Thus, by appropriately controlling the quantity $\Delta\phi$ added to $\phi_{nom}$, the output frequency of the DDS $f_{DDS}$ can be controlled accordingly. The size of the phase increment determines the actual output frequency and the fixed binary width q of the accumulator (which overflows) determines the minimum frequency resolution of the DDS.

Figure 11A:
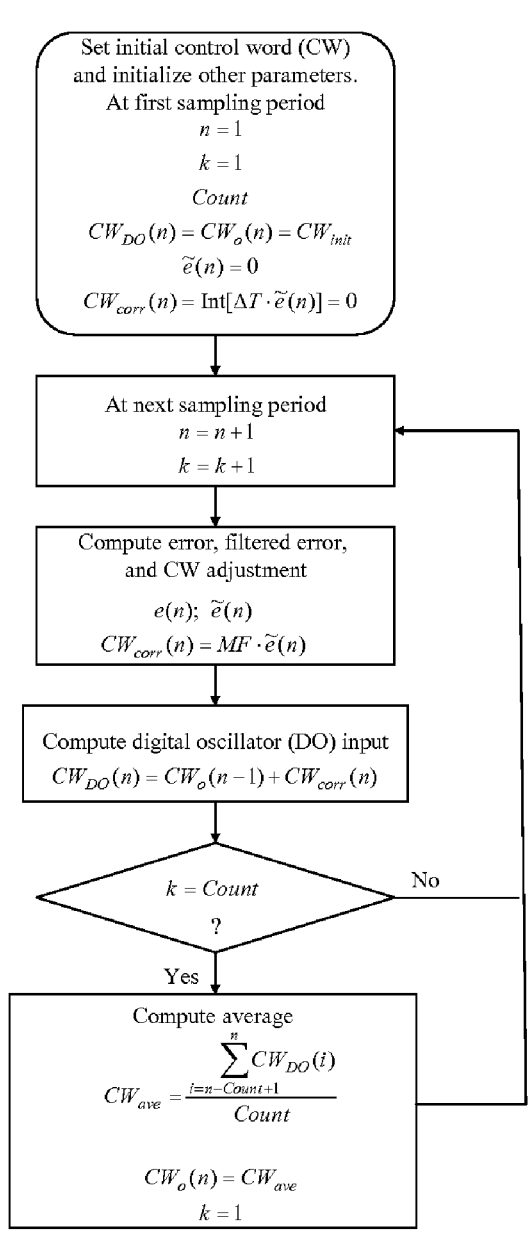
FIGS. 11a and 11b are flow diagrams that illustrate adaptive re-computation of the nominal control word of the DO.
Figure 11B:
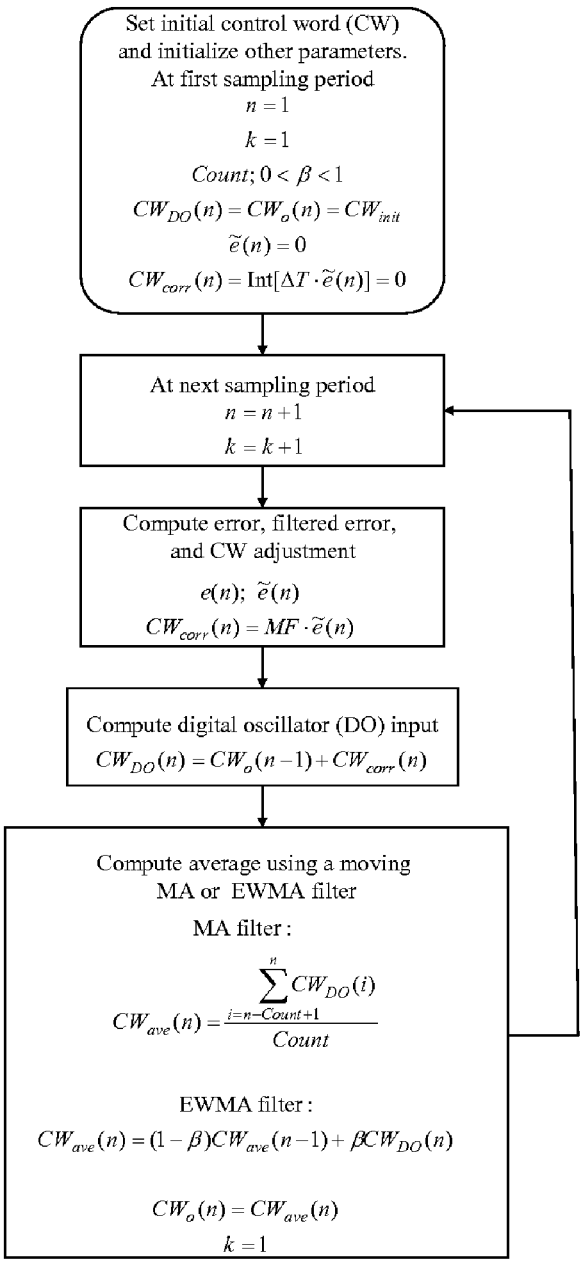

Referring to FIGS. 11a and 11b, the nominal control word of the DO ideally produces the desired nominal frequency. During tracking of the reference frequency, any error encountered produces a control word offset that when added to the nominal control word setting minimizes the error, the so-called principle of negative feedback control. In practice, however, the nominal control word has to be precisely determined from measurements or from the DO data sheet. In other situations, for instance, when the high speed oscillator of the DO is of lower quality and performance degrades due to temperature and aging, (e.g., XO or VCXO), then it may not be possible to accurately determine the exact nominal control word value. In this situation it would be desirable to have a technique that can adaptively determine the optimal nominal control word setting to eliminate the need to have an accurate initial control word setting before use and/or to have to manually readjust the nominal control setting during operation.

One advantage of adaptively determining the optimal nominal control word setting is that it enables the control word offset computed during operation to be as small as possible. When the control word offset needed to minimize the error is obtained, the error begins to get smaller and in turn, reduces the control word offset, causing the error to grow again. When a large control word offset is needed, the cycle will be long and the correction will be less accurate than when the control word offset is small.

In the ADPLL, the input frequencies $f_s$ and $\hat{f}_s$ are essentially being divided down to the lower frequencies $f_{\Delta T}=f_s/\Delta T$ and $f_{\Delta R}=\hat{f}_s/\Delta R$, respectively, before being passed to the PD. In addition, the errors e(n) are determined at the lower frequency domain, that is, using $f_{\Delta T}=f_s/\Delta T$ and $f_{\Delta R}=\hat{f}_s/\Delta R$ as the PD inputs instead of frequencies $f_s$ and $\hat{f}_s$. In a steady-state (or tracking phase) of the ADPLL, we get $f_s \approx \hat{f}_s$ (or similarly $f_{\Delta T} \approx f_{\Delta R}$). We also know that given a timestamp generation period of $\Delta T$ (which is equal to $\Delta R$ in a system without delay variations), we get the following frequency relationship for a system without delay variations, $\hat{f}_s=\Delta T \cdot f_{\Delta T}$. Let us denote the scaled-down nominal frequency as $f_{temp}=f_{nom}/\Delta T$. From the above we note that measurement and control are carried out at the clock frequency $f_{\Delta T} \approx f_{\Delta R}$ which is essentially the sampling frequency for the receiver PLL. The errors e(n) from the PD are generated at this frequency $f_{\Delta T} \approx f_{\Delta R}$, but, we see that the receiver oscillator operates at the service frequency $f_s \approx \hat{f}_s$. Also, we note that the loop parameters derived above are based on the sampling frequency $f_{\Delta T} \approx f_{\Delta R}$. Thus, the error values generated at the lower frequency $f_{\Delta T} \approx f_{\Delta R}$ have to be scaled to appropriate values so that they can applied to the receiver oscillator which operates at the service frequency $f_s \approx \hat{f}_s$. Below we describe new mapping functions for mapping the filtered error values generated by the loop filter (which operates at the lower nominal frequency $f_{temp}=f_{nom}/\Delta T$) into appropriate values for the controlling the DO (which operates at the higher nominal frequency $f_{nom}$).

Figure 12:
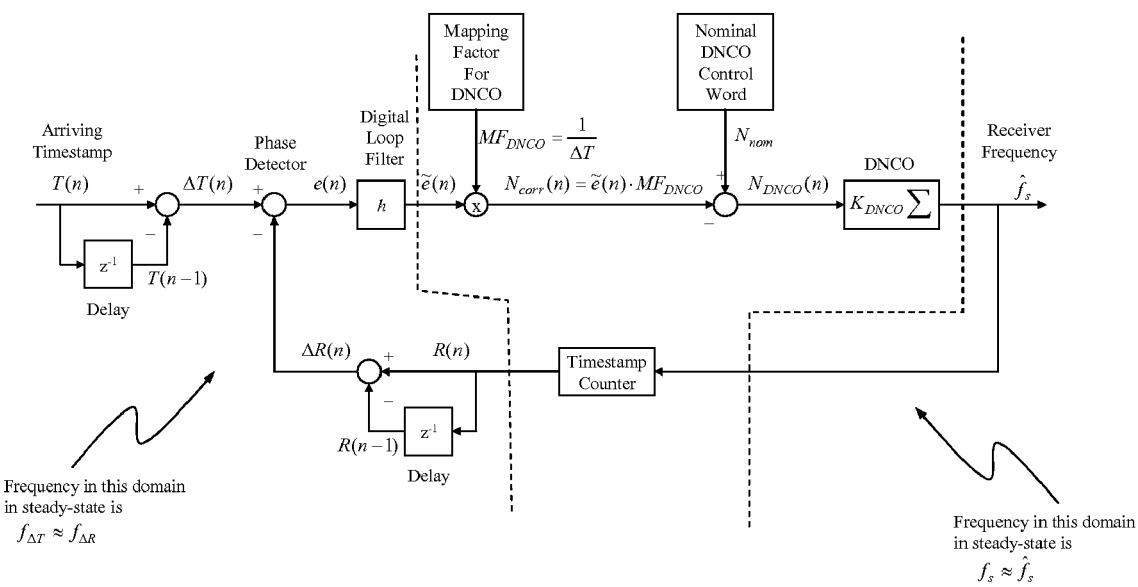
FIG. 12 illustrates a DNCO-based ADPLL with an error a mapping function.

FIG. 12 illustrates a DNCO-based ADPLL with a mapping function that allows a simple and seamless approach for converting the filtered errors into corresponding DNCO control word values. Denote $N_{DNCO}(f_{temp},n)$ as the DNCO control input at time n computed based on system parameters and the scaled-down nominal frequency $f_{temp}$, and $f(f_{temp})$ as the DNCO output frequency obtained as a result of applying $N_{DNCO}(f_{temp},n)$. Now given the error e(n) and the computed filter gains $K_1$ and $K_2$ (which are computed based on the system parameters and the scaled down nominal frequency $f_{temp}=f_{nom}/\Delta T$), the loop filter output can be computed as follows:

$$v(n)=K_2 e(n)+v(n-1), \quad \text{(Eq. 1)}$$

$$N_{corr}(f_{temp},n)=K_1 e(n)+v(n). \quad \text{(Eq. 2)}$$

The DNCO control input then becomes $$N_{DNCO}(f_{temp},n)=N_{nom}(f_{temp})-N_{corr}(f_{temp},n) \quad \text{(Eq. 3)}$$

But given that the DNCO output has nominal frequency of $f_{nom}$ while the inputs to the PD have $f_{temp}=f_{nom}/\Delta T$, the control output $N_{DNCO}(f_{temp},n)$ has to be transformed from the $f_{temp}=f_{nom}/\Delta T$ domain to the $f_{nom}$ domain to give $N_{DNCO}(f_{nom},n)$. To see how $N_{DNCO}(f_{temp},n)$ and $N_{DNCO}(f_{nom},n)$ are related, let us observe the following effects at the DNCO with internal high-speed clock frequency $f_o$:

$$f(f_{temp}) = \frac{f_o}{N_{DNCO}(f_{temp},n)}, \quad \text{(Eq. 4)}$$

$$f(f_{nom}) = \frac{f_o}{N_{DNCO}(f_{nom},n)}. \quad \text{(Eq. 5)}$$

From these two equations we obtain $$N_{DNCO}(f_{nom},n) = \frac{f(f_{temp})}{f(f_{nom})} N_{DNCO}(f_{temp},n) \quad \text{(Eq. 6)}$$
$$= \frac{1}{\Delta T} N_{DNCO}(f_{temp},n)$$

Now substituting (Eq. 3) into (Eq. 6), we get $$N_{DNCO}(f_{nom},n) = \frac{f(f_{temp})}{f(f_{nom})}[N_{nom}(f_{temp})-N_{corr}(f_{temp},n)], \quad \text{(Eq. 7)}$$

$$N_{DNCO}(f_{nom},n) = \frac{f(f_{temp})}{f(f_{nom})}N_{nom}(f_{temp}) - \frac{f(f_{temp})}{f(f_{nom})}N_{corr}(f_{temp},n).$$

Similar to (Eq. 4), (Eq. 5) and (Eq. 6), we also note that $$N_{nom}(f_{nom}) = \frac{f(f_{temp})}{f(f_{nom})}N_{nom}(f_{temp}). \quad \text{(Eq. 8)}$$

Thus, substituting (Eq. 8) into (Eq. 7), we obtain $$N_{DNCO}(f_{nom},n) = N_{nom}(f_{nom}) - \frac{f(f_{temp})}{f(f_{nom})}N_{corr}(f_{temp},n) \quad \text{(Eq. 9)}$$
$$= N_{nom}(f_{nom}) - N_{corr}(f_{nom},n),$$

rounded to the nearest integer, which also implies that $$N_{corr}(f_{nom},n) = \quad \text{(Eq. 10)}$$
$$\frac{f(f_{temp})}{f(f_{nom})}N_{corr}(f_{temp},n) = \frac{N_{nom}(f_{nom})}{N_{nom}(f_{temp})}N_{corr}(f_{temp},n).$$

But we see that $$\frac{f(f_{temp})}{f(f_{nom})} = \frac{N_{nom}(f_{nom})}{N_{nom}(f_{temp})} = \frac{1}{\Delta T}. \quad \text{(Eq. 11)}$$

Thus, $$N_{corr}(f_{nom}, n) = \frac{1}{\Delta T} \cdot N_{corr}(f_{temp}, n). \quad \text{(Eq. 12)}$$

Equation (Eq. 12) means that, although, the correction factor $N_{corr}(f_{temp}, n)$ was obtained based on the error e(n) and the computed filter gains $K_1$ and $K_2$ (computed from the system parameters and the scaled down nominal frequency $f_{temp} = f_{nom}/\Delta T$), its corresponding correction factor at $f_{nom}$ (which is the DNCO nominal output) can readily be obtained by applying the mapping factor, $MF_{DNCO} = 1/\Delta T$. This equation allows for two frequency domains to be used in the ADPLL design and at the same time obtain correct control inputs for proper system operation based on the ADPLL analysis. The complete timestamp-based ADPLL with DNCO is shown in FIG. 12.

Figure 13:
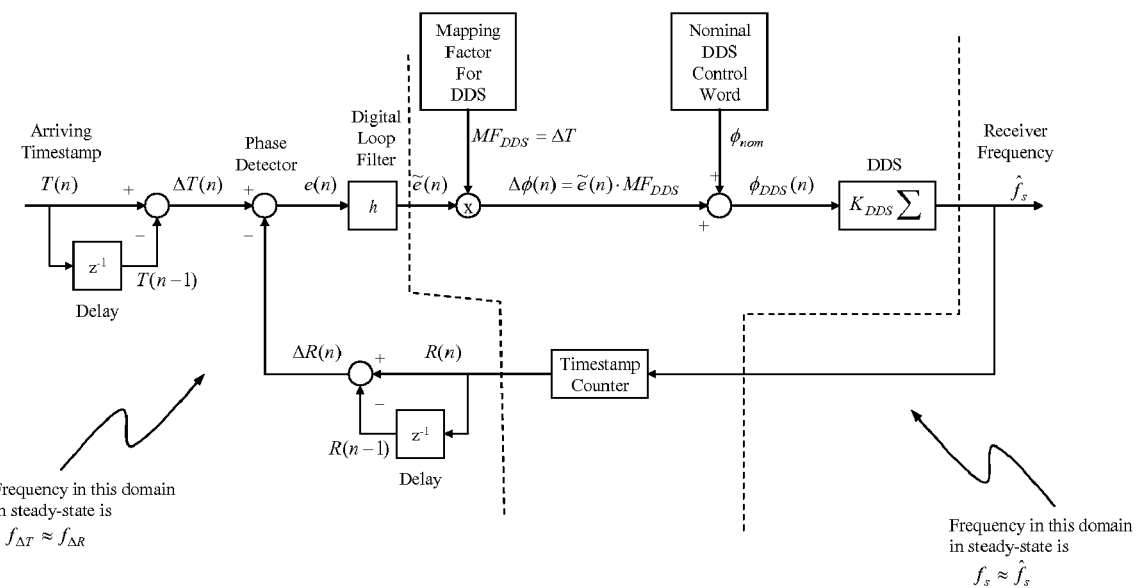
FIG. 13 illustrates a DDS-based ADPLL with an error mapping function.
Figure 14:
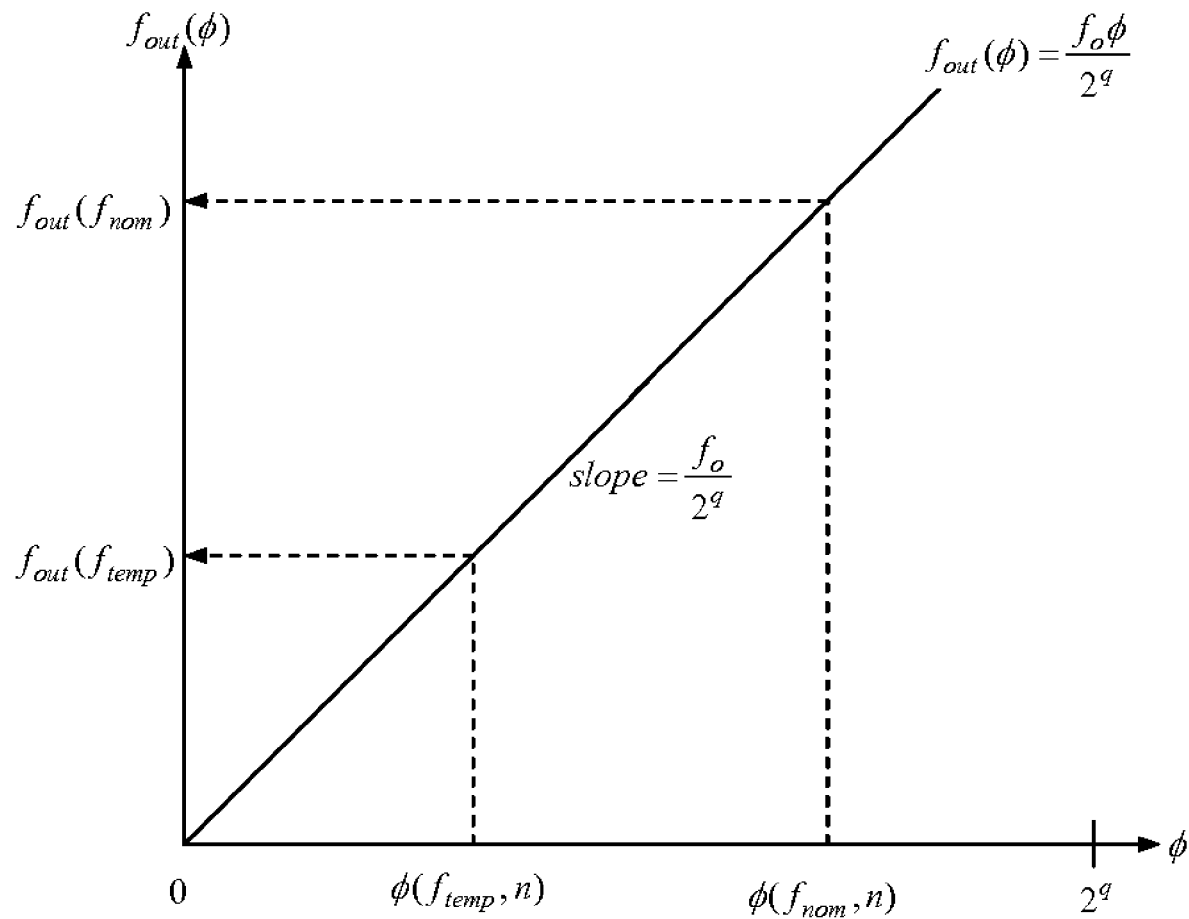
FIG. 14 illustrates DDS output frequency as a function of the control input.

FIG. 13 illustrates a DDS-based ADPLL with an error mapping function, and FIG. 14 illustrates DDS output frequency as a function of the control input. Similar to the above discussion we develop a new mapping function for mapping the filtered error values generated by the loop filter (which operates at the lower nominal frequency $f_{temp} = f_{nom}/\Delta T$) into appropriate values for the controlling the DDS (which operates at the higher nominal frequency $f_{nom}$). Denote $\phi(f_{temp}, n)$ as the DDS control input at time n computed based on system parameters at the scaled-down nominal frequency $f_{temp}$, and $f_{out}(f_{temp})$ as the DDS output frequency obtained as a result of applying $\phi(f_{temp}, n)$. Now given the error e(n) and the computed filter gains $K_1$ and $K_2$ (which are computed based on the system parameters and the scaled down nominal frequency $f_{temp} = f_{nom}/\Delta T$), the loop filter output can be computed as follows:

$$v(n) = K_2 e(n) + v(n-1), \quad \text{(Eq. 13)}$$

$$\Delta\phi(f_{temp}, n) = K_1 e(n) + v(n). \quad \text{(Eq. 14)}$$

The DDS control input then becomes $$\phi(f_{temp}, n) = \phi_{nom}(f_{temp}) + \Delta\phi(f_{temp}, n), \quad \text{(Eq. 15)}$$

rounded to the nearest integer. But given that the DDS output has nominal frequency of $f_{nom}$ while the inputs to the PD have $f_{temp} = f_{nom}/\Delta T$, the control output $\phi(f_{temp}, n)$ has to be transformed from the $f_{temp} = f_{nom}/\Delta T$ domain to the $f_{nom}$ domain to give $\phi(f_{nom}, n)$. To see how $\phi(f_{temp}, n)$ and $\phi(f_{nom}, n)$ are related, let us observe the following effects at the DDS with high-speed clock $f_o$:

$$f_{out}(f_{temp}) = \frac{f_o \cdot \phi(f_{temp}, n)}{2^q}, \quad \text{(Eq. 16)}$$

$$f_{out}(f_{nom}) = \frac{f_o \cdot \phi(f_{nom}, n)}{2^q}. \quad \text{(Eq. 17)}$$

From these two equations we obtain $$\phi(f_{nom}, n) = \frac{f_{out}(f_{nom})}{f_{out}(f_{temp})} \phi(f_{temp}, n) \quad \text{(Eq. 18)}$$

$$= \frac{1}{\Delta T} \phi(f_{temp}, n)$$

Now substituting (Eq. 15) into (Eq. 18), we get $$\phi(f_{nom}, n) = \frac{f_{out}(f_{nom})}{f_{out}(f_{temp})}[\phi_{nom}(f_{temp}) + \Delta\phi(f_{temp}, n)], \quad \text{(Eq. 19)}$$

$$\phi(f_{nom}, n) = \frac{f_{out}(f_{nom})}{f_{out}(f_{temp})}\phi_{nom}(f_{temp}) + \frac{f_{out}(f_{nom})}{f_{out}(f_{temp})}\Delta\phi(f_{temp}, n).$$

Similar to (Eq. 16), (Eq. 17) and (Eq. 18), we also note that $$\phi_{nom}(f_{nom}) = \frac{f_{out}(f_{nom})}{f_{out}(f_{temp})}\phi_{nom}(f_{temp}). \quad \text{(Eq. 20)}$$

Thus, substituting (Eq. 20) into (Eq. 19), we obtain $$\phi(f_{nom}, n) = \phi_{nom}(f_{nom}) + \frac{f_{out}(f_{nom})}{f_{out}(f_{temp})}\Delta\phi(f_{temp}, n) \quad \text{(Eq. 21)}$$

$$= \phi_{nom}(f_{nom}) + \Delta\phi(f_{nom}, n),$$

which also implies that $$\Delta\phi(f_{nom}, n) = \frac{f_{out}(f_{nom})}{f_{out}(f_{temp})}\Delta\phi(f_{temp}, n) = \frac{\phi_{nom}(f_{nom})}{\phi_{nom}(f_{temp})}\Delta\phi(f_{temp}, n). \quad \text{(Eq. 22)}$$

But we also see that $$\frac{f_{out}(f_{nom})}{f_{out}(f_{temp})} = \frac{\phi_{nom}(f_{nom})}{\phi_{nom}(f_{temp})} = \Delta T. \quad \text{(Eq. 23)}$$

Thus $$\Delta\phi(f_{nom}, n) = \Delta T \cdot \Delta\phi(f_{temp}, n). \quad \text{(Eq. 24)}$$

The mapping factor in this ADPLL is also $MF_{DDS} = \Delta T$. Notice that $MF_{DDS} = 1/MF_{DNCO}$. The complete timestamp-based ADPLL with DDS is shown in FIG. 13.

While the invention is described through the above exemplary embodiments, it will be understood by those of ordinary skill in the art that modification to and variation of the illustrated embodiments may be made without departing from the inventive concepts herein disclosed. Moreover, while the preferred embodiments are described in connection with various illustrative structures, one skilled in the art will recognize that the system may be embodied using a variety of specific structures. Accordingly, the invention should not be viewed as limited except by the scope and spirit of the appended claims.

What is claimed is:

1. Apparatus for synchronizing a local clock at a receiver with a clock at a transmitter, where indications of transmitter clock signals are communicated to the receiver as timestamps, comprising:

a phase detector operable to compute an error signal indicative of differences between the timestamps and a local clock signal;

a loop filter operable to reduce jitter and noise in the error signal, and thereby produce a first control signal in a first frequency domain;

a mapping function to scale the first control signal from the first frequency domain to a second control signal in a second frequency domain, wherein the mapping function is based on the inverse of the magnitude of the nominal sampling interval between receipt of timestamps;

a digital oscillator operable to oscillate at a frequency based at least in-part on the second control signal, and thereby produce a digital oscillator output signal; and a timestamp counter operable to count pulses in the digital oscillator output signal, and output the local clock signal.

2. The apparatus of claim 1 wherein the loop filter includes a low-pass filter.

3. The apparatus of claim 1 wherein the digital oscillator includes a divide-by-N counter oscillator.

4. The apparatus of claim 1 wherein the digital oscillator includes a direct digital synthesizer.

5. The apparatus of claim 4 wherein the mapping function is based on the magnitude of the nominal sampling interval between the receipt of timestamps.

6. The apparatus of claim 1 wherein the direct digital synthesizer includes a phase accumulator operable to generate a phase component of the local clock signal.

7. The apparatus of claim 6 wherein the direct digital synthesizer includes a mapping device operable to store samples of sinusoid indexed by the output of the phase accumulator.

8. The apparatus of claim 7 wherein the digital synthesizer includes a digital to analog converter operable to produce an output signal based at least in-part on the output of the mapping device.

9. The apparatus of claim 8 wherein the digital synthesizer includes a low-pass filter operable to produce an output signal based at least in-part on the output of the digital to analog converter.

10. A method for synchronizing a local clock at a receiver with a clock at a transmitter, where indications of transmitter clock signals are communicated to the receiver as timestamps, comprising the steps of:

computing, with a phase detector, an error signal indicative of differences between the timestamps and a local clock signal;

reducing jitter and noise in the error signal with a loop filter, thereby producing a first control signal in a first frequency domain;

scaling the first control signal from the first frequency domain to a second control signal in a second frequency domain with a mapping function, wherein the mapping function is based on the inverse of the magnitude of the nominal sampling interval between receipt of timestamps;

producing a digital oscillator output signal with a digital oscillator operable to oscillate at a frequency based at least in-part on the second control signal; and counting pulses in the digital oscillator output signal with a timestamp counter, thereby producing the local clock signal.

11. The method of claim 10 wherein the loop filter includes a low-pass filter.

12. The method of claim 10 wherein the digital oscillator includes a divide-by-N counter oscillator.

13. The method of claim 10 wherein the digital oscillator includes a direct digital synthesizer.

14. The method of claim 13 wherein the mapping function is based on the magnitude of the nominal sampling interval between receipt of timestamps.

15. The method of claim 10 wherein the direct digital synthesizer includes a phase accumulator, and including the further step of generating a phase component of the local clock signal with the phase accumulator.

16. The method of claim 15 wherein the direct digital synthesizer includes a mapping device, and including the further step of maintaining samples of sinusoid indexed by the output of the phase accumulator.

17. The method of claim 16 wherein the digital synthesizer includes a digital to analog converter, and including the further step of producing an analog output signal based at least in-part on the output of the mapping device with the digital to analog converter.

18. The method of claim 17 wherein the digital synthesizer includes a low-pass filter, and including the further step of producing an output signal based at least in-part on the output of the digital to analog converter with the low-pass filter.

* * * * *